(12) United States Patent
Nakano et al.

(10) Patent No.: US 8,167,611 B2
(45) Date of Patent: May 1, 2012

(54) DRYING FURNACE FOR COATED FILM

(75) Inventors: Teruyuki Nakano, Hiroshima (JP); Yasuhiro Kozawa, HIroshima (JP)

(73) Assignee: Kabushiki Kaisha Ishiihyoki, Hiroshima (JP)

( * ) Notice: Subject to any disclaimer, the term of this patent is extended or adjusted under 35 U.S.C. 154(b) by 857 days.

(21) Appl. No.: 11/659,317

(22) PCT Filed: Aug. 22, 2005

(86) PCT No.: PCT/JP2005/015221
§ 371 (c)(1), (2), (4) Date: Oct. 16, 2008

(87) PCT Pub. No.: WO2006/022232
PCT Pub. Date: Mar. 2, 2006

(65) Prior Publication Data
US 2010/0167224 A1 Jul. 1, 2010

(30) Foreign Application Priority Data

Aug. 24, 2004 (JP) .................................. 2004-243930

(51) Int. Cl.
*F27D 3/06* (2006.01)

(52) U.S. Cl. .......... 432/126; 432/253; 118/729; 414/935

(58) Field of Classification Search ................. 432/253, 432/258, 259, 120, 126, 127; 118/724, 725, 118/728, 729, 730; 414/935, 937; 219/443.1, 219/444.1, 439
See application file for complete search history.

(56) References Cited

U.S. PATENT DOCUMENTS

| | | | | |
|---|---|---|---|---|
| 6,796,054 | B2* | 9/2004 | Minami et al. | 34/443 |
| 6,893,805 | B2* | 5/2005 | Iseki et al. | 430/330 |
| 2002/0148566 | A1* | 10/2002 | Kitano et al. | 156/345.51 |
| 2004/0126713 | A1* | 7/2004 | Shiraishi et al. | 430/322 |
| 2004/0177917 | A1* | 9/2004 | Adachi | 156/230 |

FOREIGN PATENT DOCUMENTS

| | | |
|---|---|---|
| JP | 9-4974 | 1/1997 |
| JP | 10-76211 | 3/1998 |
| JP | 2001-12856 | 1/2001 |
| JP | 2002-195755 | 7/2002 |
| JP | 2002-225329 | 8/2002 |

* cited by examiner

*Primary Examiner* — Gregory A Wilson
(74) *Attorney, Agent, or Firm* — Wenderoth, Lind & Ponack, L.L.P.

(57) ABSTRACT

In drying of a glass substrate to which a coated film is applied, the heating and drying is conducted while feeding means 10, 18, which always moves on a lower surface of the glass substrate 6 to which the coated film is applied, abuts against the substrate, in order to solve a problem that when the lower surface of the coated film is supported for a long time, supporting traces occur and thereby quality of the glass substrate is reduced. With this configuration, traces of the pin 11, 12, 21 are less likely to occur.

6 Claims, 5 Drawing Sheets

DRYING FURNACE FOR COATED FILM

FIELD OF THE INVENTION

The present invention relates to a drying furnace for a coated film on a substrate, which is a glass substrate for a liquid crystal display or a substrate for a semiconductor wafer or the like and of which a surface is provided with the coated film.

BACKGROUND OF THE INVENTION

In recent years, in the manufacture of liquid crystal displays, thinner and larger glass substrates have been used with the aim of upsizing, producing on a large scale, and reducing thickness. In addition, a method for applying an oriented film, which serves as a coated film, to the glass substrate by an ink jet printer has begun to be employed.

However, in the drying of the coated film, when the glass substrate has been supported by a fixed pin in a fixed position during the drying of the coated film, a temperature difference between the glass substrate and the abutment perimeter of the fixed pin causes the coated film to dry unevenly and pin traces to occur, thereby leading to a quality problem.

In order to prevent such uneven drying and pin traces, a drying furnace has been proposed (Patent Document 1). The drying furnace conducts the drying with a lower surface of the glass substrate supported alternately by a fixed pin and a lift pin, which moves up and down near the fixed pin.
Patent Document 1: JP No. 10-76211A Even with such a configuration in which the drying is achieved with the lower surface of the glass substrate supported alternately by the fixed pin and the lift pin in different positions, the lower surface is merely supported at two points alternately, regardless of drying time of the coating liquid in the drying furnace. Thus, it is feared that both the fixed pin and the lift pin leave traces.

The present invention provides a drying furnace for the coated film by which the supporting pin is less likely to leave traces on the glass substrate during the drying.

SUMMARY OF INVENTION

In order to solve the aforementioned problem, a drying furnace for a coated film of the present invention has a carrier port for a substrate, which is formed, on the side of the furnace, heating means which heats and dries the coated film on the substrate, and feeding means which abuts against the lower surface of the substrate and moves abutment position against the substrate during the heating and drying of the coated film.

With this configuration, the heating and drying is conducted with the abutment point against the lower surface of the substrate changing during the drying. In addition, hot plate heaters are sequentially arranged in the order of hot plate heater, substrate, and hot plate heater such that the substrate is sandwiched by the hot plate heaters. The carrier port of the substrate and the feeding means are provided between the upper and lower hot plate heaters, the feeding means abutting against the lower surface of the substrate and moving the abutment position against the substrate during the heating and drying of the coated film.

With this configuration, the substrate is uniformly heated and dried by the upper and lower hot plate heaters, and a leveling effect of the coated film is promoted by increasing the temperature slowly during the initial drying, and thereafter sufficient heat is applied to the coated film to dry the coated film. By providing the plurality of hot plate heaters above and below the substrate, fewer heat sources can achieve the heating. In addition, the heating and drying can be conducted with the abutment point against the lower surface of the substrate changing during the drying.

The feeding means has a supporting pin, which supports the lower surface of the substrate carried in from the carrier port, and a moving pin, which moves vertically from a lower position to a higher position than the supporting pin by driving means and also moves horizontally. The abutment positions between the supporting pin or the moving pin and the lower surface of the substrate always changes, thereby not leaving pin traces.

In addition, the feeding means is formed of a plurality of rotators and pins which radially protrude from the rotators and abut against the lower surface of the substrate, and the interval of the pins is arranged such that the pins always abut against the lower surface of the substrate when the rotators rotate. Therefore, the abutment position against the lower surface of the substrate always changes and the glass substrate can move horizontally. As a result, the heat of the hot plate heater can be transferred more uniformly so as not to leave pin traces.

In a drying furnace for a coated film of the present invention, since the abutment position against a lower surface of a substrate always changes during the drying, traces of a supporting pin do not occur as in the conventional art and the quality defect can be prevented. In addition, since uniform heating can be achieved by using upper and lower hot plate heaters as heating means, uneven drying can be prevented and leveling of the coated film and the drying can be surely conducted, thereby preventing dripping.

BRIEF DESCRIPTION OF DRAWINGS

FIG. 5(a) is a diagram illustrating a state where a substrate is supported by a fixed pin when being carried in.

FIG. 9(a) is a diagram illustrating a state where the substrate is carried in.

EXPLANATION OF REFERENCE NUMBERS 1 drying furnace for a coated film
2 hot plate heater (heating means)
3 drying chamber
6 glass substrate
10, 18 feeding means
11 supporting pin 12 moving pin
20 rotator
21 pin

DETAILED DESCRIPTION OF THE INVENTION

Hereinafter, Embodiment 1 of the present invention will be described with referring to FIGS. 1 to 5.

Figure 1:
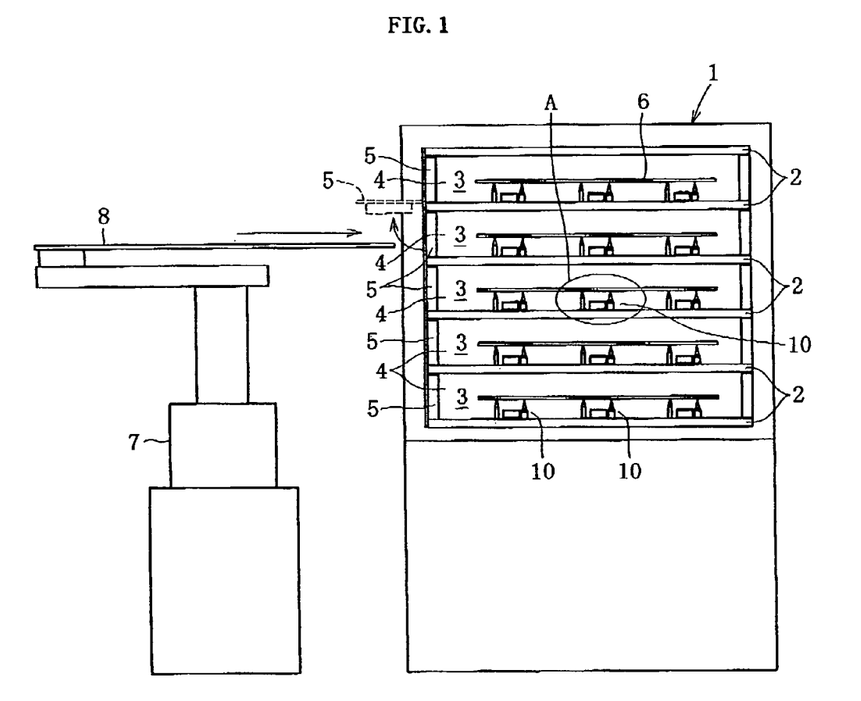
FIG. 1 is a schematic diagram of a drying furnace for a coated film illustrating Embodiment 1.
Figure 2:
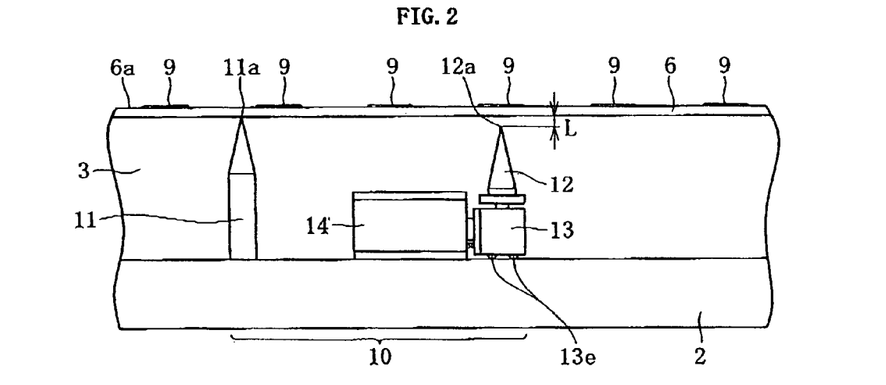
FIG. 2 is an enlarged view of A of FIG. 1.
Figure 3:
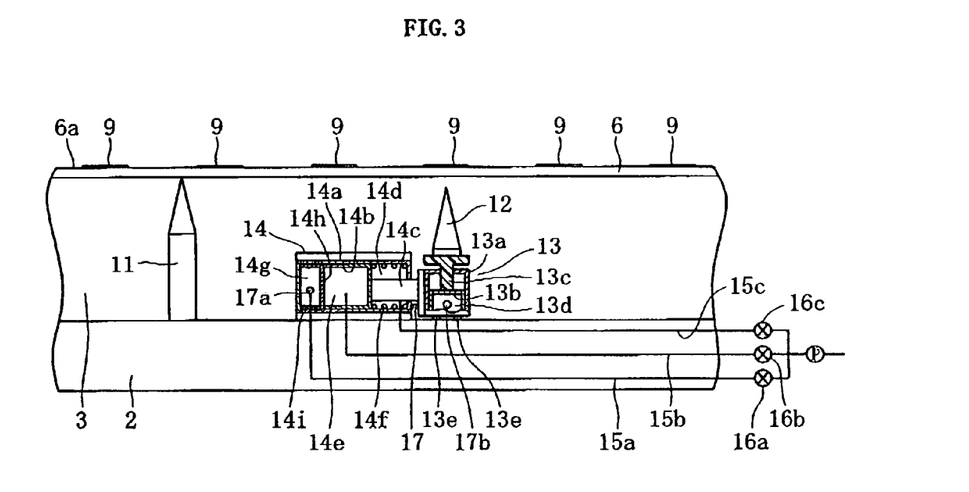
FIG. 3 is a cross-section view of FIG. 2.
Figure 4:
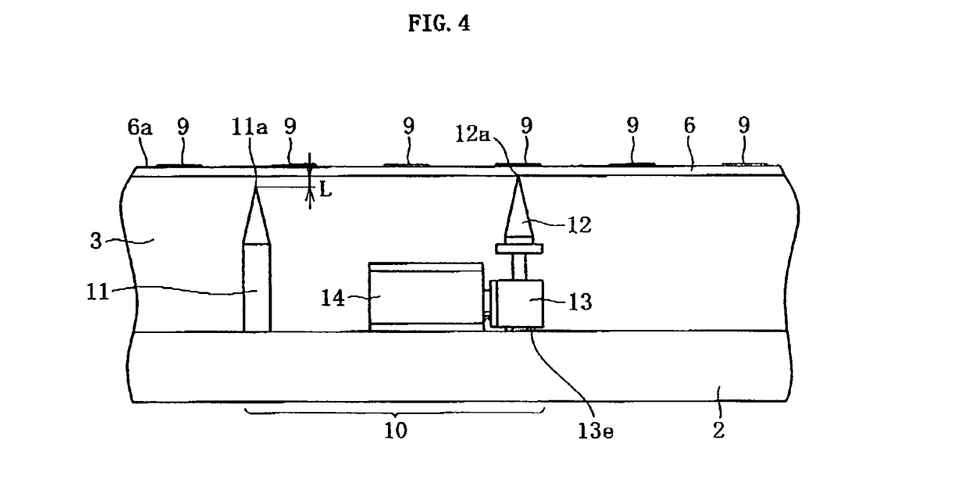
FIG. 4 is an explanatory drawing illustrating an operation state of a vertical expansion-and-contraction mechanism of FIG. 2.
Figure 5A:
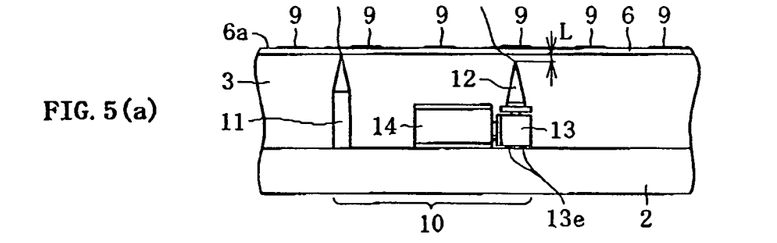
Figure 5B:
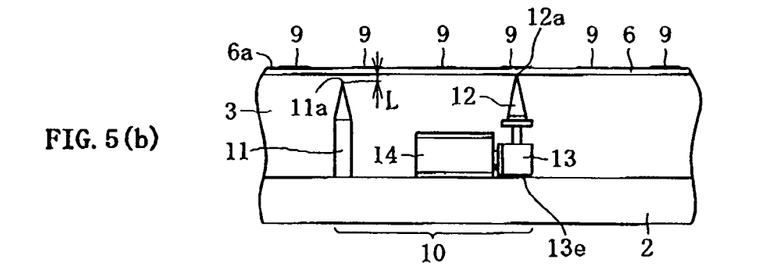
FIG. 5(b) is a diagram illustrating a state where a moving pin moves up.
Figure 5C:
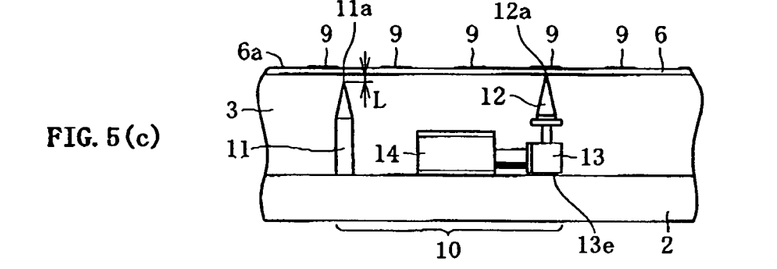
FIG. 5(c) is a diagram illustrating a state where the moving pin moves horizontally.
Figure 5D:
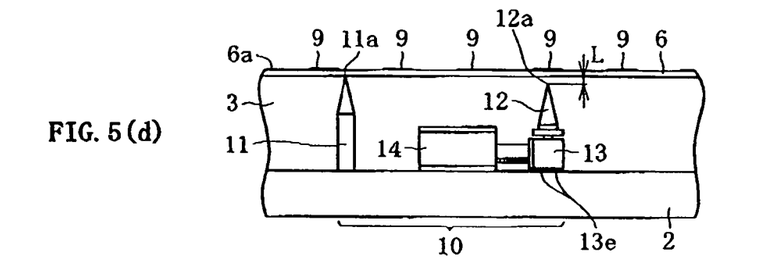
FIG. 5(d) is a diagram illustrating a state where the moving pin moves down and the substrate is supported by the fixed pin.
Figure 5E:
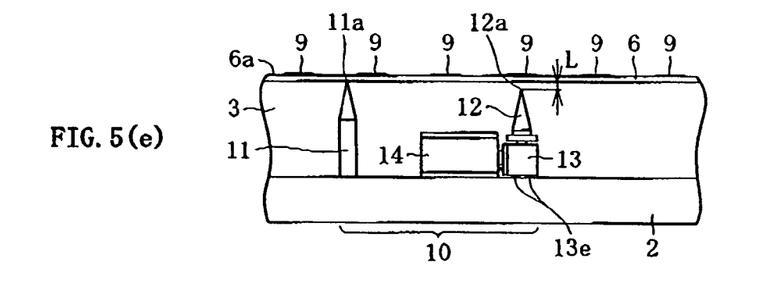
FIG. 5(e) is a diagram illustrating a state where the moving pin changes into a waiting state.

FIG. 1 is a schematic diagram of a drying furnace for a coated film illustrating Embodiment 1. FIG. 2 is an enlarged view of A of FIG. 1. FIG. 3 is a cross-section view of FIG. 2. FIG. 4 is an explanatory drawing illustrating an operation state of a vertical expansion-and-contraction mechanism of FIG. 2. FIG. 5(a) is a diagram illustrating a state where a substrate is supported by a fixed pin when being carried in, FIG. 5(b) is a diagram illustrating a state where a moving pin moves up, FIG. 5(c) is a diagram illustrating a state where the moving pin moves horizontally, FIG. 5(d) is a diagram illustrating a state where the moving pin moves down and the substrate is supported by the fixed pin, and FIG. 5(e) is a diagram illustrating a state where the moving pin changes into a waiting state.

In the figures, a drying furnace for a coated film 1 sequentially has a hot plate heater 2, a drying chamber 3, the hot plate heater 2, the drying chamber 3 from bottom up to form a five-stage drying chamber 3, 3, . . . . The side of the drying chamber 3 is provided with a carrier port 4, and the upper surface is provided with a carrier door 5 with a hinge (not shown in the figures).

The hot plate heater 2 represents a form of heating means, and has a panel-type electric heater (not shown in the figures) on upper and lower surfaces except for the uppermost and lowermost stages. The hot plate heater 2 at the uppermost stage has the panel-type electric heater (not shown in the figures) on the lower surface, and the hot plate heater 2 at the lowermost stage has one on the upper surface. Each panel-type electric heater has the same calorific power. However, when it is difficult to obtain the uniform temperature near the upper and lower centers of the drying chamber 3, it is desirable that the calorific power of the upper and lower electric heaters is adjusted and set to be uniform temperature.

A glass substrate 6 is carried in and out the drying chamber 3 by a carrier robot 7 which received the glass substrate 6 transferred from the previous step not shown. The carrier robot 7 moves up and down to a carrier port 4 of each drying chamber 3, and has an arm 8 extending from the carrier port 4 into the drying chamber 3. The glass substrate 6 is mounted on the arm 8 and is carried in the drying chamber 3.

The glass substrate 6 is rectangular, and a coated film 9, which is an oriented film having very low viscosity by diluting polyimide with solvent, is printed on the surfaces by an ink-jet printer (not shown in the figures) with an upper surface 6a directed upward.

Feeding means 10 is arranged on the upper surfaces of the hot plate heaters 2 except for the hot plate heater 2 provided on the uppermost stage. In other words, the feeding means 10 is provided on the bottom surfaces of the drying chambers 3.

The feeding means 10 has a supporting pin 11, which abuts against and supports the lower surface of the glass substrate 6 carried in through the carrier port 4, and a moving pin 12. The moving pin 12 is attached to a vertical air cylinder 13 that is a vertical expansion-and-contraction mechanism which moves the top 12a of the moving pin 12 vertically (in a Z-axis direction) to be lower and higher than the top 11a of the supporting pin 11. The vertical air cylinder 13 is also attached to a horizontal air cylinder 14 which is a horizontal expansion-and-contraction mechanism moving horizontally.

The vertical air cylinder 13 has a piston 13b which moves up and down and a rod 13c protruded upwardly from the piston 13b within a casing 13a. A chamber 13d for applying pressure to and pushing up the piston 13b is provided below the piston 13b. A roller 13e is attached to the bottom of the vertical air cylinder 13 so as to move horizontally, and the vertical air cylinder 13 is intended to roll on the upper surface of the hot plate heater 2.

The horizontal air cylinder 14 has a piston 14b which moves from side to side within a casing 14a, and a rod 14c protruded from the piston 14b (right in FIG. 3). The top of the rod 14c is fixed by the casing 13a of the vertical air cylinder 13 and a screw (not shown in the figures). Chambers 14d, 14e, each to which pressurized air is supplied such that the piston 14b moves to the top dead center (state where the piston moves to the right in FIG. 3) and the bottom dead center (state where the piston moves to the left in FIG. 3), are defined in the casing 14a. A power of a spring 14f is applied to the piston 14b so that the piston 14b is generally located at the bottom dead center side.

In addition, a chamber 14g supplying air to the chamber 13c is formed next to the chamber 14e. The chamber 14g is screwed to the perimeter of a cup-shaped partition 14h with a screw 14i and is fixed by screwing into the casing 14a.

The chambers 14d, 14e, 14g are coupled to an air supplying pump P through interconnections 15a, 15b, 15c and cross valves 16a, 16b, 16c which are provided in the hot plate heater 2.

The chambers 13d, 14g are coupled to each other by connecting to openings 17a, 17b of a flexible tube 17. Driving means of the moving pin 12 is formed of the vertical air cylinder 13, the horizontal air cylinder 14, the cross valves 16a, 16b, 16c and the supplying pump P.

Such feeding means 10 has a pair of the supporting pin 11 and the moving pin 12, and nine pairs are arranged to abut against the glass substrate 6 at near the four corners and intermediate positions thereof. When the supporting pin 11 or the moving pin 12 is retained to abut against the glass substrate 6, the glass substrate 6 is horizontally maintained.

The height of the supporting pin 11 is set to be slightly lower than the center in the top-to-bottom dimension of the drying chamber 3 which is formed by the upper and lower hot plate heaters 2. The purpose is to ensure that the height at which the moving pin 12 abuts and retains is not very different from the height at which the supporting pin 11 abuts and retains. The reason why is that the above setting does not prevent the arm 8 of the carrier robot 7 from moving, and that a great change of the height of the glass substrate 6 during the heating of the drying chamber does not achieve uniform heating temperature, thereby leading to a problem.

The relationship between the carrier robot 7 and the supporting pin 11 will be described below.

When reaching the entry location at which the glass substrate 6 is completely moved from the carrier port 4 into the drying chamber 3, the arm 8 of the carrier robot 7 is stopped. Then, the arm 8 moves downwardly, mounts the glass substrate 6 on the supporting pin 11, and moves to a further lower position. When reaching the further lower position, the arm 8 moves to an evacuation position at which the aim 8 completely evacuates from the carrier port 4.

In a sequence of moving of the arm 8, the supporting pin 11 abuts against the lower surface of the glass substrate 6 and retains the glass substrate 6 at near the center in height direction of the drying chamber 3.

The moving pin 12 is moved by the vertical air cylinder 13 so as to move from a higher position to a lower position than the height of the supporting pin 11. A positional relationship L between the top 12a of the moving pin 12 and the top 11a of the supporting pin 11 is 2.5 mm or more apart both at the evacuation and the operation of the moving pin. It is desired that the positional relationship L is 3 mm or more apart. This is because the coated film 9 on the glass substrate 6 is intended not to be subjected to the heat affect of the pin during the drying.

In addition, the supporting pin 11 and the moving pin 12 abut against the bottom of the glass substrate 6 at regular intervals. In order to prevent the abutment point of the supporting pin 11 against the glass substrate 6 from overlapping with the abutment point of the moving pin 12 thereagainst, the supporting pin 11 is adjusted not to overlap with the moving pin 12 in the moving direction of the glass substrate 6 and the moving pin 12 is also adjusted not to overlap with the other moving pin pins 12 in that direction.

In order to make the supporting pin 11 and the moving pin 12 less likely to be subjected to a thermal effect, the supporting pin 11 and the moving pin 12 are formed of a heat-resistant resin having low thermal conductivity and specific heat (e.g., PEEK (Polyether-ether-ketone) has thermal conductivity of 0.25 W/m·K and specific heat of 0.32 Kcal/g·°C.), thereby reducing the thermal effect to the glass substrate 6.

An abutment relationship between the supporting pin 11 or the moving pin 12 and the glass substrate 6 is preferably as small as possible, but it is generally preferable that the pin top has an angle of about 30 degrees and the top portion has a radius of 0.5 mm in terms of a mechanical strength.

Next, the operation of the coated film during the drying will be described.

The glass substrate 6 is carried in the drying chamber 3 and the carrier door 5 is closed (state illustrated in FIG. 5(a)). The hot plate heater 2 is always energized and the temperature is controlled to be constant.

By the operation, the cross valve 16a operates so that the air is supplied to the chamber 14g, and the air is supplied from the flexible tube 17 into the chamber 13d to move up the piston 13b.

The rise of the piston 13b raises the moving pin 12 coupled thereto, and the abutment of the bottom of the glass substrate 6 is changed from against the supporting pin 11 to against the moving pin 12 (state illustrated in FIG. 5(b)). The moving distance of the moving pin 12 is up to a location where the glass substrate 6 moves up 3 mm above from the top 11a of the supporting pin 11.

The cross valve 16b is opened with the glass substrate 6 abutting against the moving pin 12, and the air is supplied to the chamber 14e of the horizontal air cylinder 14 to move the piston 14b (state where the piston 14b moves to the right in FIG. 5(c)).

When the moving pin 12 finishes moving vertically and horizontally, the cross valve 16a is closed so as to complete the air supply to the vertical air cylinder 13 and the air within the chambers 13d, 14g is released and escaped outwardly through the cross valve 16a. Then, the moving pin 12 moves down because of the weight of the glass substrate 6 (state illustrated in FIG. 5(d)).

During the moving down, the glass substrate 6 is passed to the supporting pin 11. At this time, the abutment position between the supporting pin 11 and the glass substrate 6 is different from the aforementioned abutment position since the glass substrate 6 moves.

The cross valve 16b is switched to finish the air supply into the chamber 14e of the horizontal air cylinder 14, and the cross valve 16c is switched to supply air to the chamber 14d. Then, the piston 14b moves to the bottom dead center because of the spring 14f and an air pressure, and the moving pin 12 returns to the original position (state illustrated in FIG. 5(e)).

The reason why the cross valves 16a, 16b, 16c are used for the air supply is that the air in each chamber 13d, 14d, 14e 14g is released and is in an assured location when the air is not supplied into each chamber 13d, 14d, 14e, 14g.

This sequence of operations is set as one cycle, and the cycle is repeated many times during the drying. The faster the movement speed of the moving pin 12, the less the pin traces occur, and the cycle is completed for about 4 to 8 seconds depending on thickness of the coated film.

After the repetition of the cycle, the glass substrate 6 moves horizontally and the abutment position against the pins 11, 12 is moved. Therefore, a larger drying chamber 3 may be needed. After the cycle is repeated several times, the opposite cycle (FIG. 5(e)→FIG. 5(d)→FIG. 5(c)→FIG. 5(b)→FIG. 5(a)) can be in turn conducted to gradually return the abutment position to the original position.

Moreover, in order not to have the same abutment point, the moving pin 12 moves not only in the horizontal X-axis direction but in the Y-axis direction perpendicular thereto in the horizontal air cylinder 14. In this case, the moving pin 12 does not move to the same abutment point, and thereby the pin traces are less likely to occur.

Such return can achieve the downsizing of the drying chamber 3.

After time has elapsed since the beginning of the drying, the operation of the feeding means 10 stops, the carrier door 5 is opened to carry the arm 8 of the carrier robot 7 in the drying chamber 3, and the glass substrate 6 is carried out from the drying chamber 3 by the arm 8.

Therefore, during the heating of the drying chamber 3, the abutment point between the supporting pin 11 or the moving pin 12, both which support the lower surface of the glass substrate 6, and the bottom of the glass substrate 6 always moves, and the pin traces are less likely to occur on the glass substrate, thereby significantly improving the quality defect.

In addition, since a pair of hot plate heaters 2 warm the air in the drying chamber 3 uniformly and heats the glass substrate 6, the coated film can be uniformly dried. Moreover, the temperature of the glass substrate 6 increases not rapidly but slowly during the initial drying when the glass substrate 6 is carried in, the viscosity of the applied coated film is reduced and the leveling effect is promoted to enhance the uniformity of the coated film.

Moreover, after the leveling of the coated film in the initial drying is completed, the heat can be sufficiently supplied from the upper and lower hot plate heaters 2. Thus, the drying can be quickly completed, and the drying can be achieved such that dripping does not occur on the periphery of the coated film.

In Embodiment 1, the carrier port 4 was utilized both as the inlet and the outlet of the glass substrate 6, but opposite carrier ports may be provided so that one port serves as an inlet and the other as an outlet.

Moreover, the material and the dimension of the feeding means 10 are not restricted to the aforementioned material and dimension. Furthermore, although the air cylinder was used as the feeding means 10, any means can be employed as long as the means moves the moving pin along the X-, Y- or Z-axis by an expansion-and-contraction device such as a liquid cylinder and an electric solenoid. In addition, the driving means is not restricted to air, and electricity or fluid can be employed.

Figure 6:
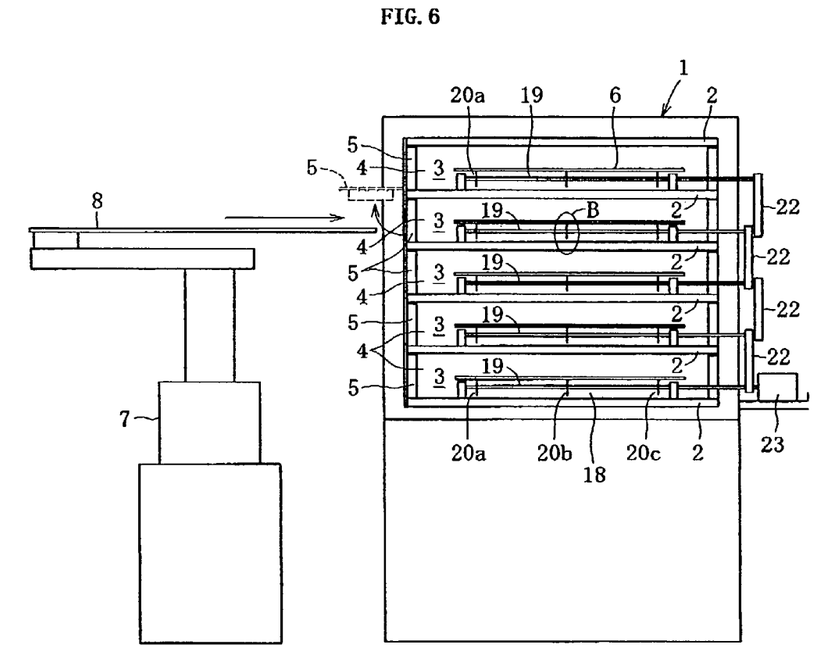
FIG. 6 is a schematic diagram of a drying furnace for a coated film illustrating Embodiment 2.
Figure 7:
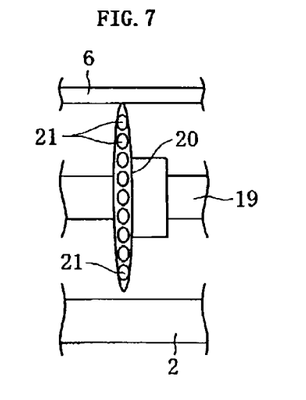
FIG. 7 is an enlarged view of B part of FIG. 6.
Figure 8:
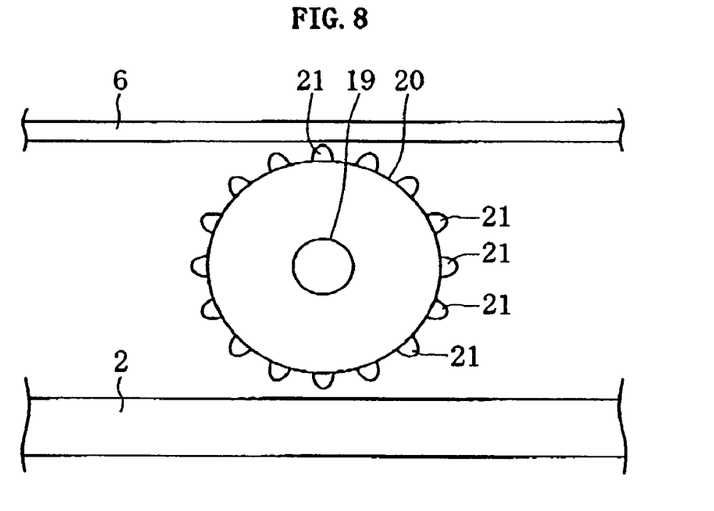
FIG. 8 is a front view of FIG. 7.
Figure 9A:
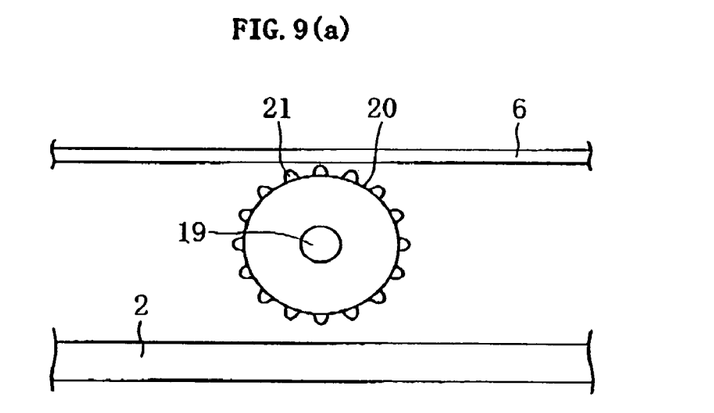
Figure 9B:
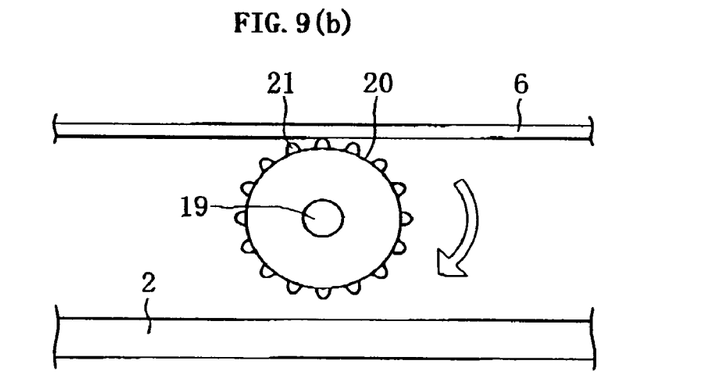
FIG. 9(b) is a diagram illustrating a state where a glass substrate is being moved.

Next, Embodiment 2 will be described. The different point from Embodiment 1 is the structure of the feeding means 18. FIG. 6 is a schematic diagram of a drying furnace for a coated film illustrating Embodiment 2. FIG. 7 is an enlarged view of B of FIG. 6. FIG. 8 is a front view of FIG. 7. FIG. 9(a) is a diagram illustrating a state where the substrate is carried in, and FIG. 9(b) is a diagram illustrating a state where a glass substrate is being moved.

The feeding means 18 is provided on the upper surface of each hot plate heater 2 except for the hot plate heater 2 arranged at the uppermost stage. In the feeding means 18, a plurality of (three arrays, in the crosswise direction in FIG. 6) disk-like rotators 20a, 20b, 20c (collectively referred to as "20") are attached to an axis 19. On the periphery of the rotator 20, pins 21 which abut against the glass substrate 6 are radially arranged from the rotator 20. The pins 21 are provided such that any one of the pins always abut against the bottom of the glass substrate 6. The axis 19 and the rotator 20 are set as one pair, and three pairs are arranged in the long direction (from the front to the back in FIG. 6).

The rotator 20 and the pins 21 are made of a heat-resistant resin (such as PEEK (Polyether-ether-ketone) having thermal conductivity of 0.25 W/m·K and specific heat of 0.32 Kcal/g·° C.), which is a material hard to give a heat effect to the glass substrate 6. The contact portion between the pin 21 and the glass substrate 6 is preferably as small as possible, but it is generally preferable that the top shape has an angle of 30 degrees and a radius of 0.5 mm in terms of a mechanical strength. In addition, the greater the number of the pins 21 the better, but the pins 21 are preferably arranged at a pitch of 3 to 5 mm, and the moving distance is preferably about 30 mm. The moving speed depends on film thickness, but it preferably takes about 30 to 60 seconds to move 30 mm. Therefore, the rotator 20 preferably rotates in forward and reverse directions.

In each feeding means 18, the axis 19 protrudes from the drying chamber 3 to the outside of the drying furnace for the coated film 1, is coupled to a connected body 22, and synchronizes with the motion of a geared motor 23 to rotate the feeding means 18 of each hot plate heater 2. Each axis 19 was coupled to the connected body 22 outside of the drying furnace for the coated film 1, but may be coupled inside thereof.

Next, the operation of the coated film during the drying will be described.

The carry of the glass substrate 6 in the drying chamber 3 is the same as that in Embodiment 1. When the glass substrate 6 is carried in the drying chamber 3, the pin 21 of the rotator 20 abuts against the lower surface of the glass substrate 6 (state illustrated in FIG. 9(a)). Then, the carrier door 5 is closed. Note that the hot plate heater 2 is always energized and the temperature is controlled to be constant.

By the operation, the geared motor 23 begins to rotate forwardly and moves the glass substrate 6 (in the state illustrated in FIG. 9(b), the move to the right therein is referred to as "rotate forwardly"). The glass substrate 6 moves about 30 mm by the aforementioned movement, and then the geared motor 23 is reversed and rotates reversely. By that movement, the glass substrate 6 moves toward the original location. After the glass substrate 6 moves about 30 mm again, the geared motor 23 rotates forwardly. The sequence is repeated.

After the drying time has elapsed, the feeding means 10 stops operating, and the carrier door 5 is opened to bring the arm 8 of the carrier robot 7 in the drying chamber 3, and the glass substrate 6 is carried out from the drying chamber 3 by the arm 8.

Therefore, during the heating of the drying chamber 3, the abutment point between the pin 21, which receives the lower surface of the glass substrate 6, and the bottom of the glass substrate 6 always moves, and the pin traces come to be less likely to occur on the coated film and the quality defect is significantly improved.

In addition, since the pair of hot plate heaters 2 warm up the air within the drying chamber 3 uniformly and heat the glass substrate 6, the coated film can be uniformly dried. Moreover, the temperature of the glass substrate 6 increases not rapidly but slowly during the initial drying when the glass substrate 6 is carried in, the viscosity of the applied coated film is reduced and the leveling effect is promoted to enhance the uniformity of the coated film.

Moreover, since the glass substrate 6 moves horizontally, dripping of the coated film hardly occurs. In addition, since the glass substrate 6 does not move up and down, the heat generated by the upper and lower hot plate heaters 2 is easily transferred to the coated film uniformly, and as a result, uneven dry due to the movement of the glass substrate 6 is less likely to occur.

Furthermore, since the heat can be sufficiently supplied from the upper and lower hot plate heaters 2 after the leveling during the initial drying of the coated film, the drying can be quickly completed and the drying can be achieved such that dripping does not occur on the periphery of the coated film.

The axes 19 of the feeding means 18 were driven by the common geared motor 23, but may be driven by respective geared motors 23.

In addition, the material of the rotator 20 and the pin 21 in Embodiment 2 is not limited to the material disclosed, and any material can be employed as long as it has a heat resistance.

What is claimed is:

1. A drying furnace for heating up a substrate having an upper surface provided with a coated film and drying the coated film, the drying furnace comprising:
    a carrier port for the substrate which is formed on a side surface;
    heating means which heats and dries the coated film of the substrate; and
    feeding means which abuts against a lower surface of the substrate and moves an abutment position against the substrate during heating and drying of the coated film,
    wherein the feeding means is formed of a supporting pin which supports the lower surface of the substrate carried in from the carrier port, and a moving pin which moves vertically from a lower location to a higher location than the supporting pin by driving means and moves horizontally.

2. The drying furnace of claim 1, wherein the heating means is a pair of upper and lower hot plate heaters sandwiching the substrate.

3. A drying furnace for heating up a substrate having an upper surface provided with a coated film and drying the coated film, the drying furnace comprising:
    a carrier port for the substrate which is formed on a side surface;
    heating means which heats and dries the coated film of the substrate; and
    feeding means which abuts against a lower surface of the substrate and moves an abutment position against the substrate during heating and drying of the coated film, wherein
    the feeding means is formed of a plurality of rotators and pins radially protruding from the rotators and abutting against the lower surface of the substrate, and
    an interval of the pins is arranged such that the pins always abut against the lower surface of the substrate when the rotators rotate.

4. The drying furnace of claim 3, wherein the heating means is a pair of upper and lower hot plate heaters sandwiching the substrate.

5. A drying furnace for heating up a substrate having an upper surface provided with a coated film and drying the coated film, the drying furnace comprising:
- a plurality of hot plate heaters sequentially arranged to have an order of a hot plate heater, the substrate and a hot plate heater such that the substrate is sandwiched by the hot plate heaters;
- a carrier port for the substrate; and
- feeding means, wherein
- the carrier port and the feeding means are provided between an upper one of the hot plate heaters and a lower one of the hot plate heaters, the feeding means abutting against a lower surface of the substrate and moving an abutment position against the substrate at heating and drying of the coated film,
- the feeding means is formed of a supporting pin which supports the lower surface of the substrate carried in from the carrier port, and a moving pin which moves vertically from a lower location to a higher location than the supporting pin by driving means and moves horizontally.

6. A drying furnace for heating up a substrate having an upper surface provided with a coated film and drying the coated film, the drying furnace comprising:
- a plurality of hot plate heaters sequentially arranged to have an order of a hot plate heater, the substrate and a hot plate heater such that the substrate is sandwiched by the hot plate heaters;
- a carrier port for the substrate; and
- feeding means, wherein
- the carrier port and the feeding means are provided between an upper one of the hot plate heaters and a lower one of the hot plate heaters, the feeding means abutting against a lower surface of the substrate and moving an abutment position against the substrate at heating and drying of the coated film,
- the feeding means is formed of a plurality of rotators and pins radially protruding from the rotators and abutting against a lower surface of the substrate, and
- an interval of the pins is arranged such that the pins always abut against the lower surface of the substrate when the rotators rotate.

* * * * *